United States Patent [19]

Matsuyama et al.

[11] Patent Number: 4,701,859

[45] Date of Patent: Oct. 20, 1987

[54] INSPECTING METHOD AND APPARATUS FOR A PHOTOMASK PATTERN

[75] Inventors: Takayoshi Matsuyama, Kawasaki; Kenichi Kobayashi, Tokyo, both of Japan

[73] Assignee: Fujitsu Limited, Kawasaki, Japan

[21] Appl. No.: 659,425

[22] Filed: Oct. 10, 1984

[30] Foreign Application Priority Data

Oct. 13, 1983 [JP] Japan .................................. 58-191618

[51] Int. Cl.⁴ ..................... G06F 15/60; G06K 9/68; G01B 11/00; H04N 7/18
[52] U.S. Cl. .......................................... 364/490; 382/8; 382/30; 382/34; 358/107; 356/394; 364/559
[58] Field of Search ................ 358/107; 364/490, 559; 382/8, 30, 33, 34; 356/394

[56] References Cited

U.S. PATENT DOCUMENTS

| | | | |
|---|---|---|---|
| 4,115,762 | 9/1978 | Akiymama et al. | 382/8 |
| 4,328,553 | 5/1982 | Fredriksen et al. | 364/559 |
| 4,334,241 | 6/1982 | Kashioka et al. | 358/107 |
| 4,556,317 | 12/1985 | Sandland et al. | 356/239 X |
| 4,569,123 | 2/1986 | Ishii et al. | 357/59 X |
| 4,581,762 | 4/1986 | Lapidus et al. | 358/107 X |

Primary Examiner—Errol A. Krass
Assistant Examiner—Joseph L. Dixon
Attorney, Agent, or Firm—Staas & Halsey

[57] ABSTRACT

A method and the apparatus for inspecting the unit pattern arrangements on a photomask to determine relative shear between the unit patterns where each unit pattern has the same shape and size and is printed repeatedly at equal intervals on the photomask. Shear-detecting-patterns are provided on each unit pattern. Adjacent shear-detecting-patterns on adjacent unit patterns are designated as combined patterns. The combined patterns arranged in the same directions make a group. To detect an irregular shear, a standard pattern is designated from the combined patterns in a group and comparison is made between each combined pattern in the group and the standard pattern. An optical image of each combined pattern in a group is and converted into electric signals. The electrical signals for the standard pattern and for the other combined patters are stored a memory. The two sets of signals are read out and compared to provide a shear difference between the patterns. The difference is determined by counting the number of occupied or unoccupied memory locations in both the standard and the other images. The difference in count produces the shear difference. The shear difference is compared with a or tolerance level and it is determined whether the combined pattern arrangement in the group is correct based on the comparison.By repeating the comparison in other groups, it can be determined whether the unit pattern arrangement is correct.

10 Claims, 20 Drawing Figures

INSPECTING METHOD AND APPARATUS FOR A PHOTOMASK PATTERN

BACKGROUND OF THE INVENTION

The present invention relates to an inspecting method and apparatus for a photomask pattern which is used in fabrication of a semiconductor device such as a semiconductor integrated circuit (IC) or a large scale semiconductor integrated circuit (LSI) and, more particularly, to an apparatus and method which automatically compares the difference in shear between unit patterns on a photomask.

Before describing the present invention, it will be necessary to explain what is required of and how to fabricate a photomask pattern. Photomasks and the devices produced therefrom generally have the following characteristics: (1) a plurality of photomask patterns are required to fabricate a semiconductor device, because the semiconductor device is fabricated by repeated printing and etching of the photomask patterns on a semiconductor wafer; (2) each photomask pattern includes a large number, for example, several thousand, unit patterns on each semiconductor die, each unit pattern having the same size and shape, so that mass production of semiconductor devices from a wafer as large as five inches in diameter is possible; (3) each photomask pattern is very complicated and achieves high packing density of the semiconductor circuits; and (4) each photomask must have a high accuracy on the order of one micron.

A photomask is made by coating a glass plate with an optically sensitive material called a sensitive plate. Then unit patterns are printed on the photomask by step and repeat exposures using an optical image produced by an original unit pattern. In the step and repeat process, the photomask is mounted on a stage and the fabrication can be accomplished by shifting the stage in a step and repeat movement while using a fixed optical system for producing the exposure.

As mentioned above, the photomask is very important in the fabrication of a semiconductor device and, as a result, must be inspected very carefully. Attention must be particularly directed to irregularities that can occur, such as irregular shifting of the stage in the step and repeat movement or rotation of the optical system, both of which can occur during mask production. Such an irregularity will cause incorrect printing on the wafer, therefore, after fabricating, the photomask pattern must be inspected, especially to determine whether the unit patterns are printed in correct positions so that wasted time can be avoided during semiconductor device production.

In the prior art inspection method, a vernier pattern is provided on each edge of each unit pattern (generally a unit pattern has four sides) and the vernier patterns of neighboring unit patterns should be adjacent to each other. A visual inspection by an inspector using a microscope determines whether vernier patterns in adjacent unit patterns are within a specified tolerance of each other. However, the large number of unit patterns on the photomask require a great deal of time to visually observe all the vernier patterns on the photomask. For example, if the total number of the unit patterns on the photomask is 5,000 and it takes 20 seconds to check the vernier patterns for adjacent unit patterns, it will take well in excess of 15 hours to inspect one photomask, thereby making such a complete inspection practically impossible in actual practice. Therefore, random inspection has been performed on selected points on the photomask pattern to reduce the inspecting time to several minutes. However, as the packing density of the semiconductor device increases, a higher degree of accuracy, such as tolerances of less than one micron, is required. The random sampling inspection method mentioned above is inadequate for such small tolerance photomasks and inspection of all the unit patterns becomes necessary.

Figure 1:
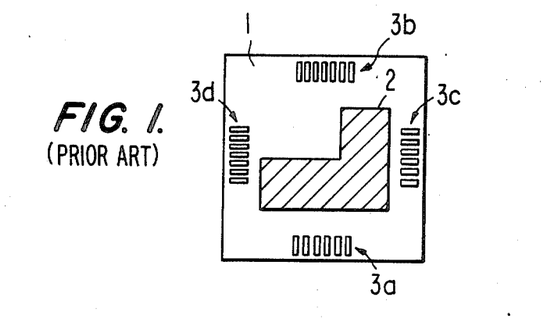
FIG. 1 is an original unit pattern having vernier patterns used in prior art inspection methods.
Figure 2:
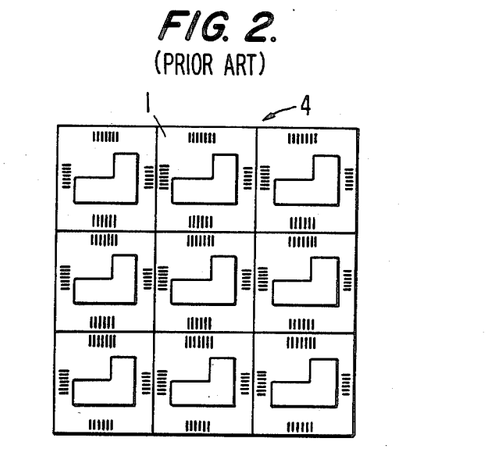
FIG. 2 is a diagram illustrating a photomask pattern on which a plurality of the unit patterns of FIG. 1 are printed.
Figure 3A:
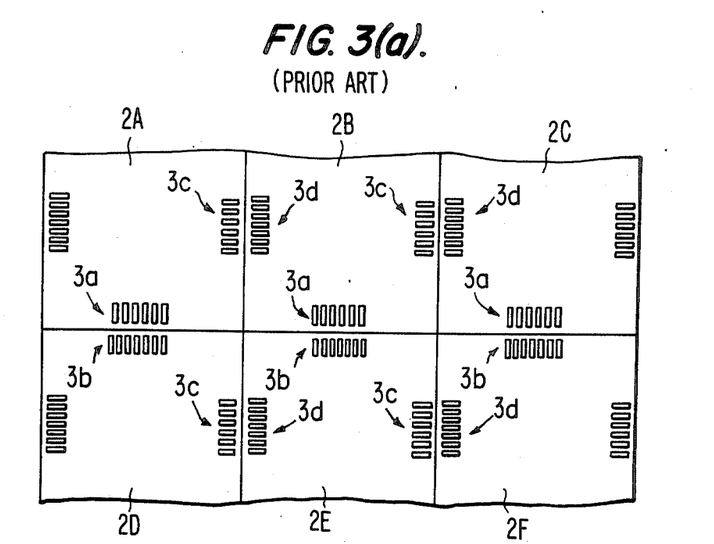
FIGS. 3(a) and 3(b), is a diagram illustrating prior art vernier patterns.
Figure 3B:
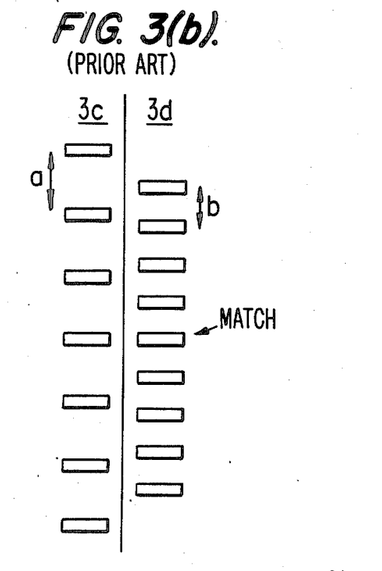

FIG. 1 is an example of an original unit pattern 1 having prior art vernier patterns 3. In the middle of unit pattern 1 is a die pattern 2, and four vernier patterns 3a, 3b, 3c and 3d are provided near the edges of the four sides of the unit pattern. The original unit pattern 1 is printed a plurality of times on a sensitive plate as represented by the photomask pattern 4 in FIG. 2. As mentioned above, the printing is made using a stage shifted in a step and repeat movement process. The movement process is very carefully controlled, however, a slight error in movement cannot be avoided in the mechanical system and the pitch between neighboring unit patterns in the latitudinal or longitudinal direction is not always equal. Of course, the pitch can have some allowable error depending upon the feature tolerance of the photomask pattern. The vernier patterns are provided to allow the inspection to measure whether the arrangement of the unit patterns is within the allowed tolerance. FIG. 3(a) illustrates an enlarged view of the vernier patterns in FIG. 2. A combination of patterns 3a and 3b in each unit pattern (2A–2F) forms a latitudinal vernier pattern. FIG. 3(b) is a further enlargement of adjacent prior art vernier patterns. In these patterns, the distance between marks is different in the adjacent vernier patterns 3c and 3d, that is, the distance "a" is greater than the distance "b". The point where the two scales match indicates the relative shear between the unit patterns. If the readings of the respective vernier patterns are within a designated allowance, then the longitudinal arrangement of the unit patterns is good. The same inspection can be made for the latitudinal arrangement by observing latitudinal vernier patterns formed by patterns 3a and 3b in each pair of adjacent unit patterns. Such a visual inspection wastes a lot of labor and time, and allows the photomask pattern to be damaged or allows dust to stick to the photomask pattern, all problems in the prior art inspecting method.

SUMMARY OF THE INVENTION

An object of the present invention is to provide an improved photomask inspecting method and provide an apparatus for performing the method.

Another object of the present invention is to provide an inspection method and apparatus that does not require the vernier patterns of the prior art.

An additional object of the present invention is to provide an automatic inspection method and apparatus that does not require inspector observation and comparison.

A further object of the present invention is to provide an inspection apparatus and method that compares relative amounts of shear between unit patterns.

The improvement in the prior art method can be obtained by applying an automatic pattern comparing method, so that the visual observation of vernier patterns and measurement of shear by human inspection is not necessary. In the present invention, shear-detectingpatterns, which are similar to the prior art vernier patterns are printed on each unit pattern; however, the shear-detecting-patterns need not be true vernier patterns, a similarity in size and shape and size is sufficient. Adjacently paired shear-detecting-patterns comprise a combined-pattern. At the beginning of the inspection, a standard pattern is designated for a group comprising the combined patterns in the latitudinal direction or longitudinal direction. The standard pattern has the same shape and size as the patterns in the group to allow it to be compared with other combined patterns in the group. An optical image of each of the combined patterns in a group is converted into electric signals. The electric signals are divided into signals associated with the standard-pattern and the other combined patterns in the group and stored in respective memories. The stored signals are read out and compared with each other. The comparision includes counting the number of memory locations indicating the absence or existance of a pattern in both the standard pattern and the other combined patterns in the group. The difference in counts, which indicates the relative difference in shear, is then compared to a shear allowance to determine whether the patterns are acceptable. The comparison is repeated for other groups on the photomask and if there is excessive shear in the photomask pattern, the irregular arrangement of the unit patterns can be detected by the comparison.

Applying the present invention to the inspection of a photomask, the inspection can be completed for all combined patterns even though the number of the unit patterns is more than 5,000 in as little as 30 minutes, thereby significantly reducing the labor and time necessary for mask inspection. The problems which occur in the prior art inspection method, such as damage to the photomask pattern and dust sticking to the photomask pattern, can also be avoided.

These together with other objects and advantages which will be subsequently apparent, reside in the details of construction and operation as more fully hereinafter described and claimed, reference being had to the accompanying drawings forming a part hereof, wherein like numerals refer to like parts throughout.

BRIEF DESCRIPTION OF THE DRAWINGS

FIG. 3, including

FIG. 4, including FIGS. 4(a)-4(d), is a diagram illustrating shear-detecting-patterns used in the present invention, where the shear-detecting-patterns are arranged in a latitudinal direction, where 4(a) is an enlargement of one of combined patterns that can be used in the present invention.

FIG. 7, including

FIG. 8, including

FIG. 10, including

DESCRIPTION OF THE PREFERRED EMBODIMENTS

According to our investigations, it has become clear that irregular printing of the unit patterns is caused by two occurrences: (1) irregular shifting of the stage caused by a mechanism for a step and repeat movement; and (2) image rotation caused by rotation of the optical system with respect to stage movement. Furthermore, it has become clear that the actual amount of the shear between adjacent unit patterns need not be measured as in the prior art inspecting method, but a determination of a deviation in shear between unit patterns throughout the mask is sufficient. That is, it is sufficient to detect a difference in the type or amount of shear in unit patterns as compared to shear in a standard pair of adjacent unit patterns. The above observations are based on the following facts:

(1) Several photomasks are required to fabricate a semiconductor device from a wafer. However, if the photomasks are produced by the same fabricating machine, each photomask tends toward having the same amount of print shear, so only a deviation in shear needs to be detected during the inspection.

(2) Shear produced by an irregular shifting of the stage tends to occur in equal amounts along the array of the unit patterns, because the stage can be smoothly shifted in the same direction on the array (latitude, for example). However, when the stage steps in another direction (longitude, for example) to print the next array, there are cases where the positioning of the stage produces a slight shear due to the change in direction of the mechanism.

(3) Shear produced by image rotation tends to occur in equal amounts throughout the mask as will be explained hereafter with respect to FIG. 5.

Figure 4A:
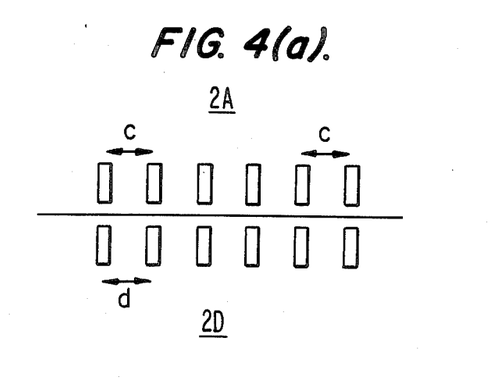

The present comparision method can be achieved without inspector observation and measurement by applying a pattern comparing method using four shear-detecting-patterns which are marked on each unit pattern and which are similar to the vernier patterns of the prior art, however, the shear-detecting-patterns need not be traditional vernier patterns, as illustrated by FIG. 4(a). A pair of shear-detecting-patterns adjacent to each other is used as an object for comparison and is called a combined pattern. FIG. 4(a) illustrates a combined pattern which can be used in the present invention. As can be seen from FIG. 4(a), the shear patterns on each adjacent unit pattern can have an equal spacing between shear marks, that is, "c" can equal "d". This makes the shear patterns easier to create than the traditional vernier patterns and less effort must be applied by the layout designer to ensure that the distances between shear marks is accurate. However, a traditional vernier pattern can be used in the present invention if so desired.

Figure 4B:
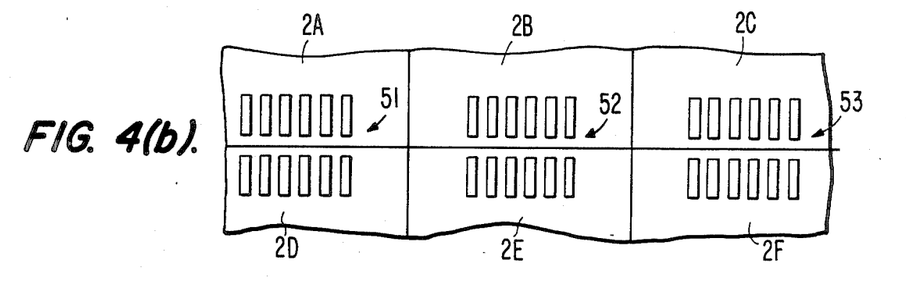
FIG. 4(b) is a diagram illustrating normally arranged combined patterns.
Figure 4C:
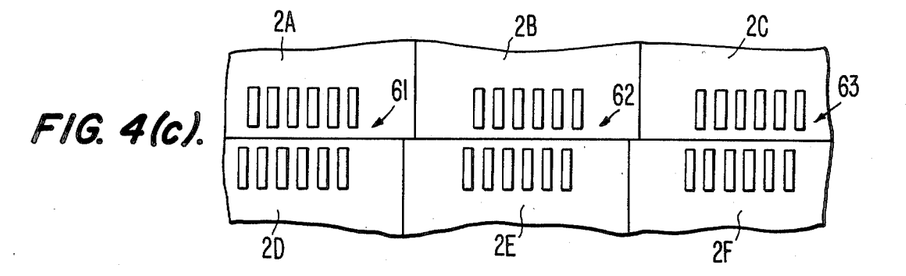
FIG. 4(c) is a diagram illustrating combined patterns each having an equal amount of shear.
Figure 4D:
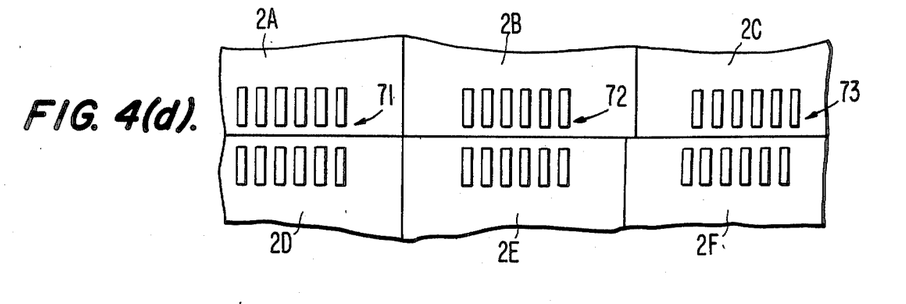
FIG. 4(d) is a diagram illustrating a shear in a standard combined pattern which deviates from the shear in other combined patterns.

FIGS. 4(b)-4(c) show combined patterns arranged in a latitudinal direction where FIGS. 4(b) and 4(c) depict correct or acceptable arrangements of combined patterns, and FIG. 4(d) depicts an unacceptable arrangement. The unit patterns 2A, and 2D, 2B and 2E and 2C and 2F are arranged adjacent to each other, and the shear-detecting-patterns on each side of a unit pattern each have an equal shape and size and are printed near an edge of each pattern side. The detection of the pattern deviation can be performed by comparing each combined pattern with a standard combined pattern ("standard pattern" hereinafter) selected from among the combined patterns each having an equal shape and size and residing in the same group. In FIG. 4(b), the unit patterns are correctly arranged, so if a combined pattern 51 is designated as a standard pattern and other combined patterns 52 and 53 are respectively compared with the standard pattern 51, "no difference" will be the result of the comparison. The same result can be obtained in FIG. 4(c) by designating combined pattern 61 as a standard pattern and comparing other combined patterns 62 and 63. However, in the case of FIG. 4(d), when the combined pattern 71 is designated as a standard pattern, the result of comparison between the standard pattern 71 and combined pattern 72 is acceptable. However, the result of comparison between standard pattern 71 and the combined pattern 73 indicates the shear deviation is unacceptable, because there is a difference in deviation between patterns 71 and 73. FIGS. 4(a-d) show the combined patterns arranged in a latitudinal direction. However, inspection can be performed in the longitudinal direction.

Figure 5:
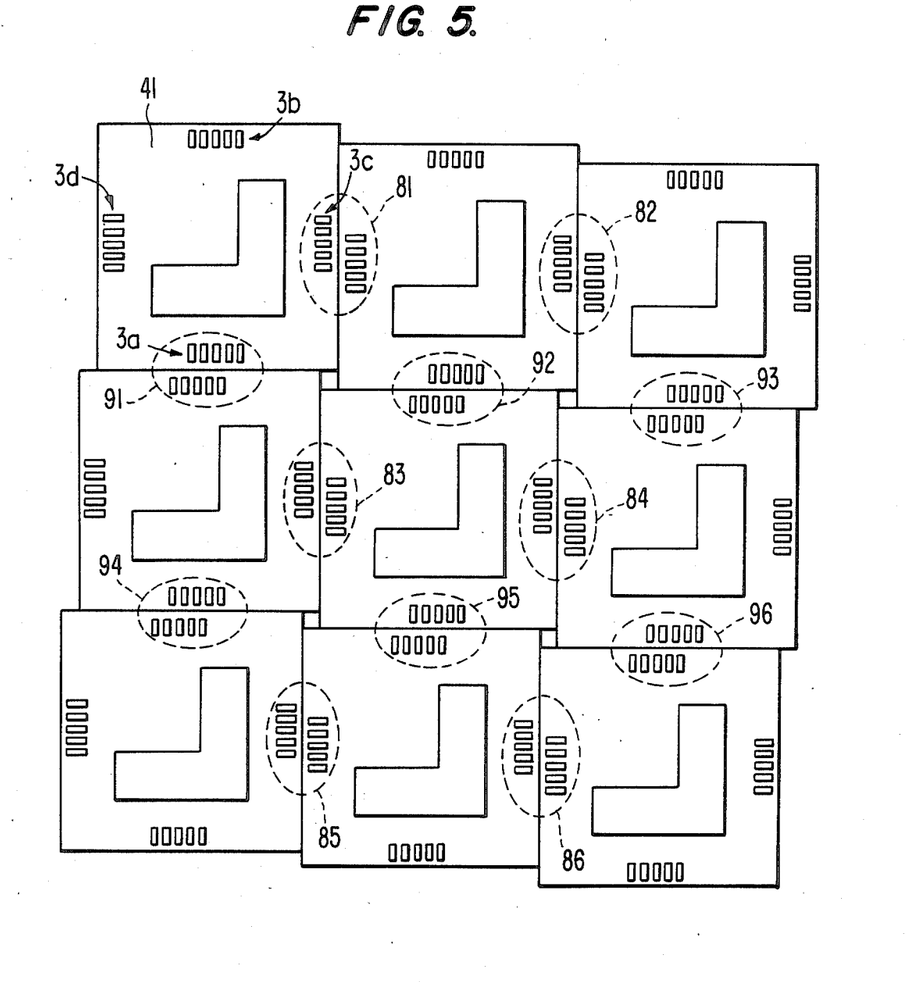
FIG. 5 is a diagram illustrating a part of a photomask pattern on which a plurality of unit patterns are printed in a situation where the image has been rotated.

FIG. 5 shows a part of a photomask pattern consisting of adjacent unit patterns each being printed by a rotated image. Each unit pattern, for example, unit pattern 41, has four shear-detecting-patterns 3a, 3b, 3c and 3d; and a pair of shear-detecting-patterns which are adjacent to each other produce a combined pattern as indicated by the dotted circle 81 or 91. Combined patterns shown by dotted circles 81, 82, 83, 84,—designate one group, and combined patterns 91, 92, 93, 94, 95,—designate another group, where each group respectively has an equal shape and size. As can be seen by FIG. 5, shear due to rotation is uniform throughout the mask and there is no difference in the amount of deviation among the unit patterns.

Figure 6:
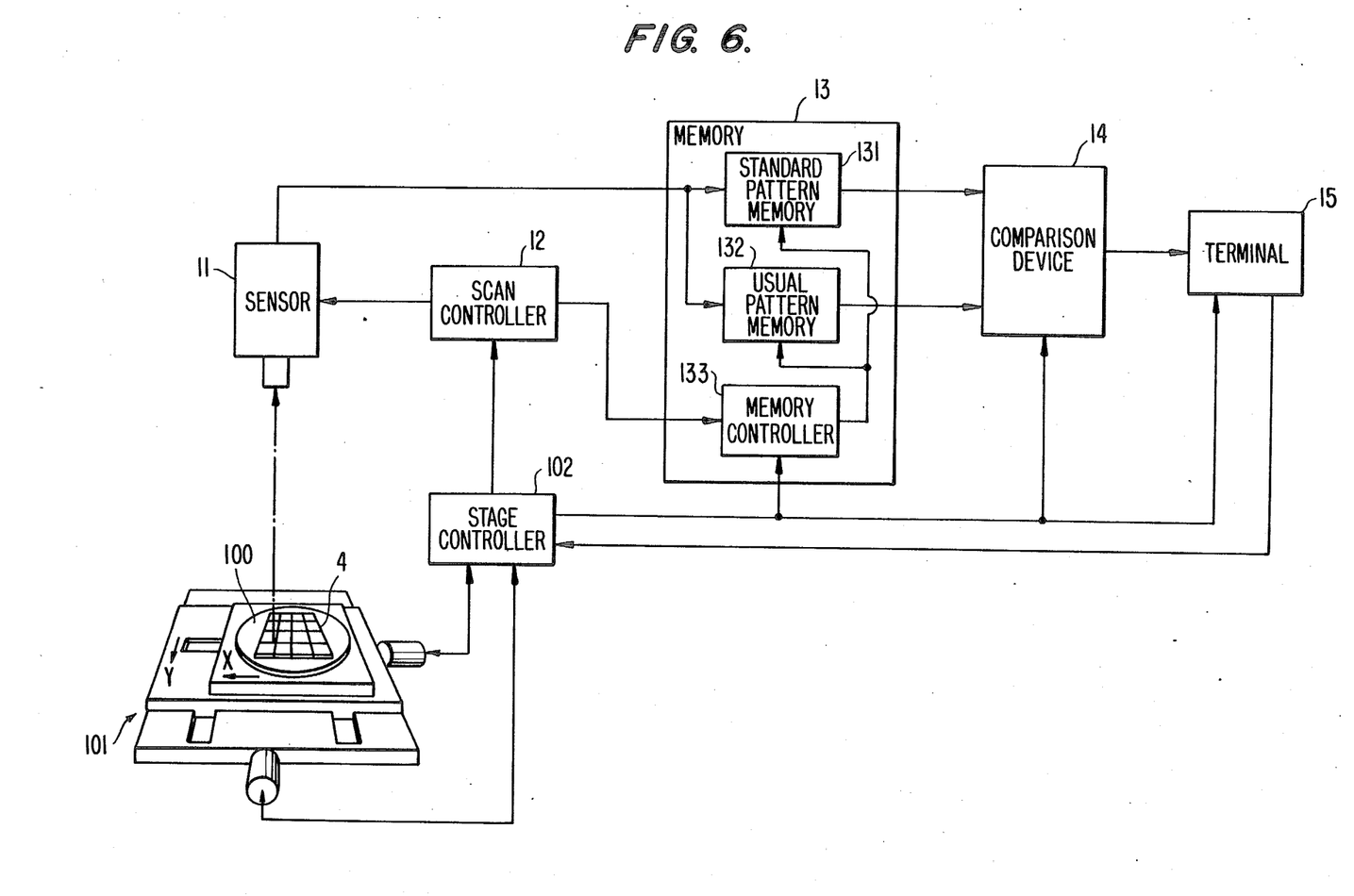
FIG. 6 is a block diagram of a preferred embodiment of the present invention apparatus.

The combined patterns can be compared and the shear deviation detected automatically by the present invention. FIG. 6 shows a block diagram of a preferred embodiment for an inspecting apparatus of the present invention in which a photomask 100, on which a photomask pattern 4 has been printed, is mounted on a stage 101 and is to be inspected. The stage 101 comprises movement elements which shift the photomask 100 in X and/or Y directions in a step and repeat type movement which is controlled by a stage controller 102. An image sensor 11 optically senses the images of the combined patterns of the photomask pattern 4 where the optical image is produced by optical scanning or electrical scanning of sensing elements within the image sensor 11. Scanning is controlled by a scan controller 12. The produced optical image has sufficient resolution to detect the details of the combined patterns. The optical image is converted into electric signals by the image sensor. Address signals for a matrix corresponding to the optical image are provided by the scan controller 12. The electric signals and the address signals are applied to a memory unit 13 which comprises a standard pattern memory 131, a usual pattern memory 132, and a memory controller 133. The electric signals stored in the standard pattern memory 131 are the signals from the standard pattern in a group of the combined patterns each having the same shape and size; and the other electric signals are stored in the usual pattern memory 132 and represent signals from another combined pattern in the group which will be compared to the standard pattern.

More details of the comparison process will be explained using FIG. 5. As can be seen from FIG. 5, the combined patterns 81, 82, 83, 84, 85 and 86 have the same pattern, comprise one group and are called the first group; and the combined patterns 91, 92, 93, 94, 95 and 96 similarly comprise another group and are called the second group. Any combined pattern, for example, the combined pattern 81 and 91, can be designated as standard patterns for the respective first and second groups. The stage movement for the comparison operation can be arranged as follows: first, the stage shifts to compare each combined pattern in the first group with the standard pattern 81 in the order of patterns 82, 83, 84, 85, 86 and so forth; second, the stage shifts to compare each combined pattern in second group with the standard pattern 91 in the order of patterns 92, 93, 94, 95, 96 and so forth. The designation of the standard patterns and the order of stage movement can be previously determined and stored in an inspecting program which may be provided in a program memory; the stage control programming can be provided by one of ordinary skill in the art.

In accordance with the inspecting program, the stage controller 102 shifts the stage 101, and the scan controller 12 controls the image sensor 11 to produce the optical image and provides corresponding address signals to the memory controller 133. The image sensor 11 is a CCD device whose output is converted to digital signals representing the existance "1" or absence "0" of the pattern on the mask. The sensor has, for example, 10,000 sensing elements arranged in a 100 by 100 matrix. This matrix is scanned and the digital representation of the pattern is stored in the appropriate memory. The memory controller 133 controls the standard pattern memory 131 and the usual pattern memory 132 to write in and read out the electric signals from the standard pattern and other combined patterns in a group.

Figure 7A:
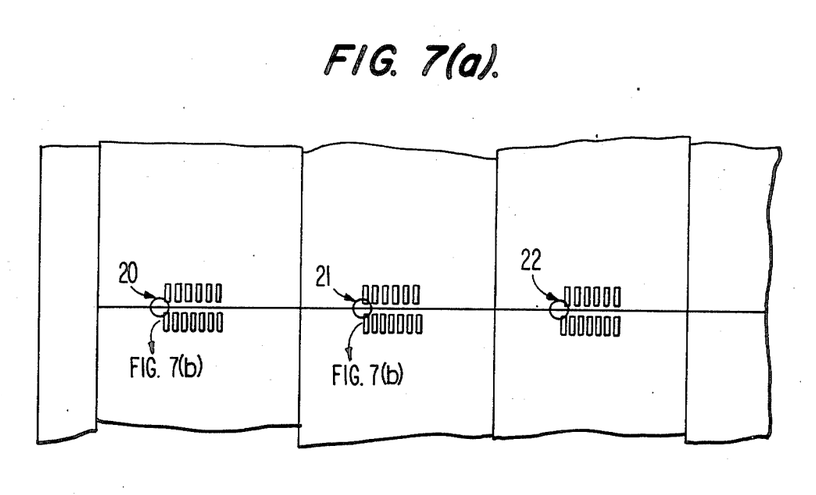
FIGS. 7(a)-7(c), illustrates the portion of the pattern image stored and used to obtain a difference in shear.
Figure 7B:
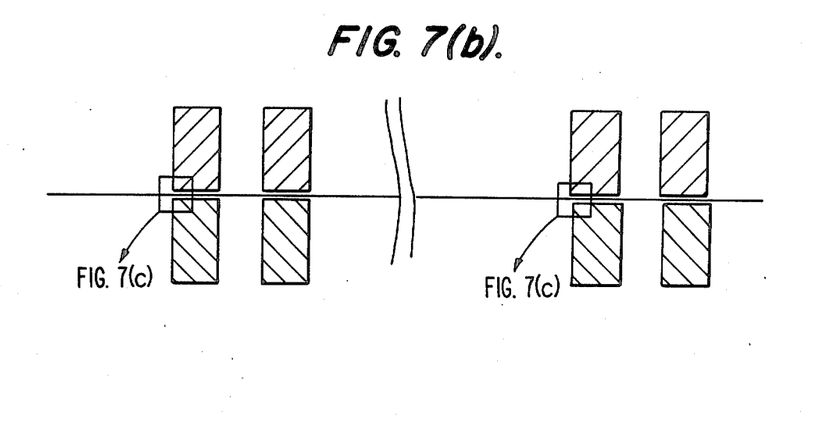
Figure 7C:
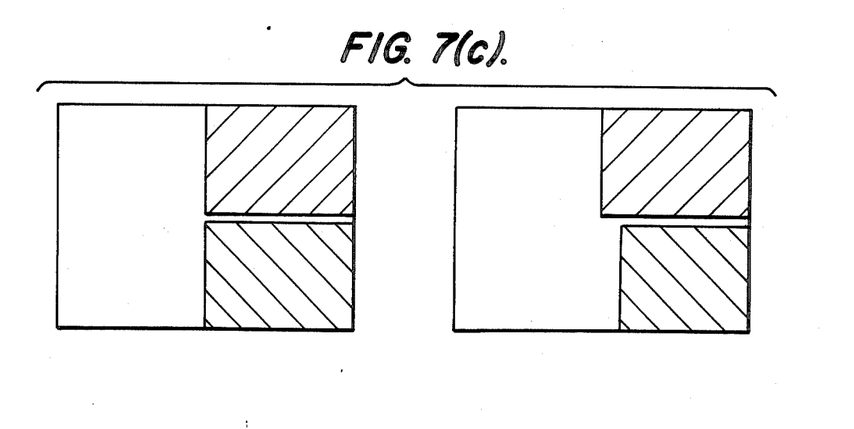

FIG. 7(a) indicates by circles 20-22 the general areas of the optical image viewed by the sensor 11 where 20 is the image area of the standard pattern and 21 is the image area of one of the other combined patterns that has a shear deviation. FIG. 7(b) illustrates the circled areas enlarged and FIG. 7(c) illustrates the images as they will be compared to determine the difference in shear.

Figure 8A:
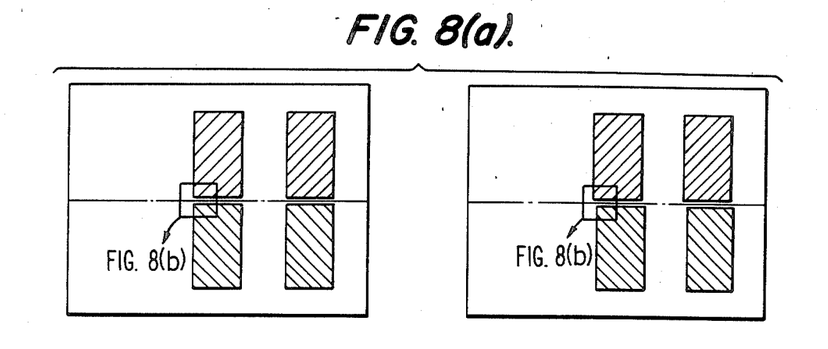
FIGS. 8(a)-8(d), illustrates an alignment of the pattern images in the memories prior to comparison.
Figure 8B:
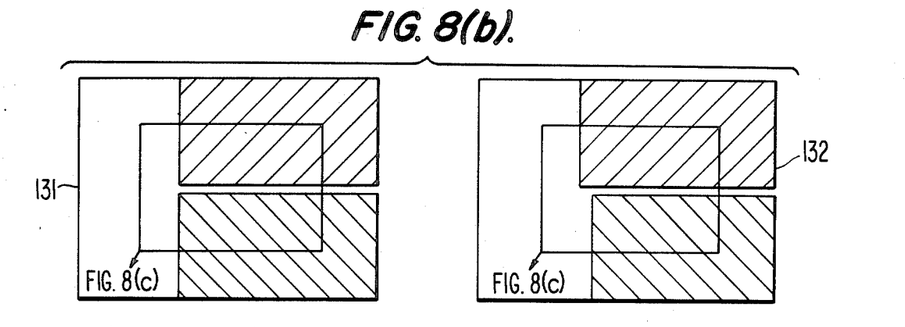
Figure 8C:
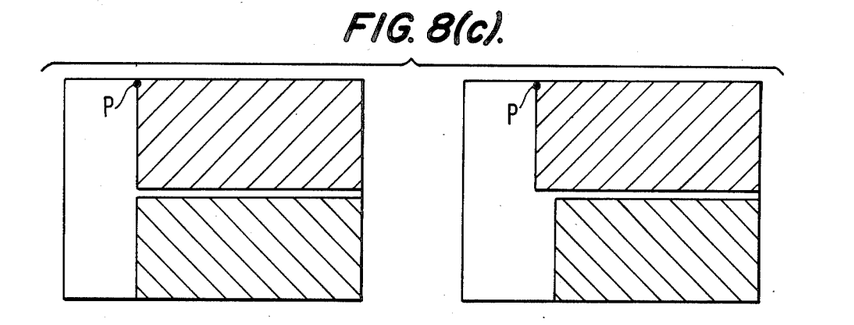
Figure 8D:
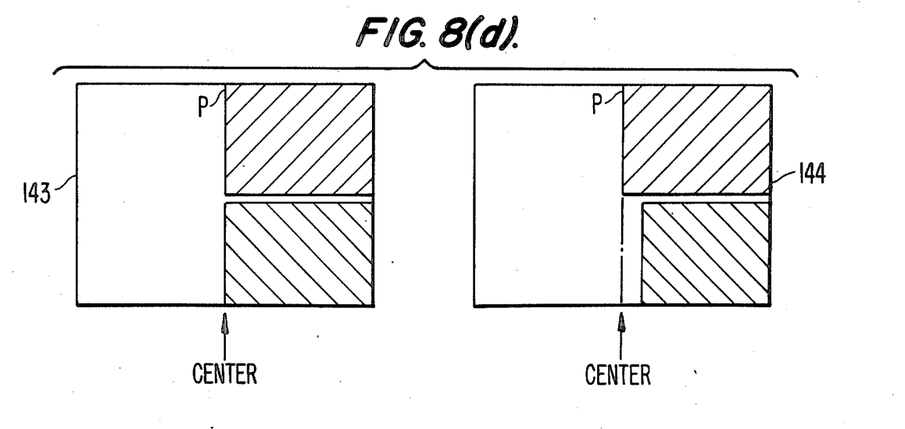

The digital images stored in the memories 131 and 132 can be misadjusted or misaligned when loaded into the memories because of positioning error that occurs during the step and repeat movement of the stage 101, as illustrated in FIGS. 8(a) and 8(b). To compare the shear of the images stored in standard 131 and usual 132 memories, it is necessary to properly align the images. FIG. 8(b) illustrates the standard image and the image to be compared as they are stored in the memories 131 and 132, respectively, where the hatched portion represents memory locations containing "1"s. The rectangles within FIG. 8(b) indicate the portions of the contents of the memories which will be aligned. To perform this alignment, the data in the rectangles in memories 131 and 132 are transferred to respective standard and usual submemories. The submemories are smaller in storage capacity and can only store the part of the image enclosed by the rectangles, for example, a submemory can be a 60 by 60 matrix. During the transfer, a position adjustment circuit shifts the data so that one of the pattern edges occupies the middle elements of the submemories. The alignment can be accomplished by scanning the top row of each memory matrix and finding the first memory location from the left that is occupied by a "1". This position P, see FIG. 8(c), can be determined by a simple counting operation where a count of the number of "0"s from the left is produced. When the amount of adjustment is found separately for each image and the image is shifted by an appropriate amount to the left, as in FIG. 8(d), or to the right until the edge of the pattern (the leftmost "1") aligns with the center of the matrix during the transfer to the submemory. For example, the amount of shift can be determined by subtracting the count from one-half the width of the memory matrix. Alignment can be accomplished by a simple counter for counting the distance to the edge of the pattern in the top row of the matrix, a subtractor for subtracting the count from one-half the width of the matrix and by starting the transfer to the submemory from a memory location to the left of the pattern edge by the difference produced by the counter. The images as illustrated in FIG. 8(d) represent the contents of the standard and usual submemories after alignment.

Figure 9:
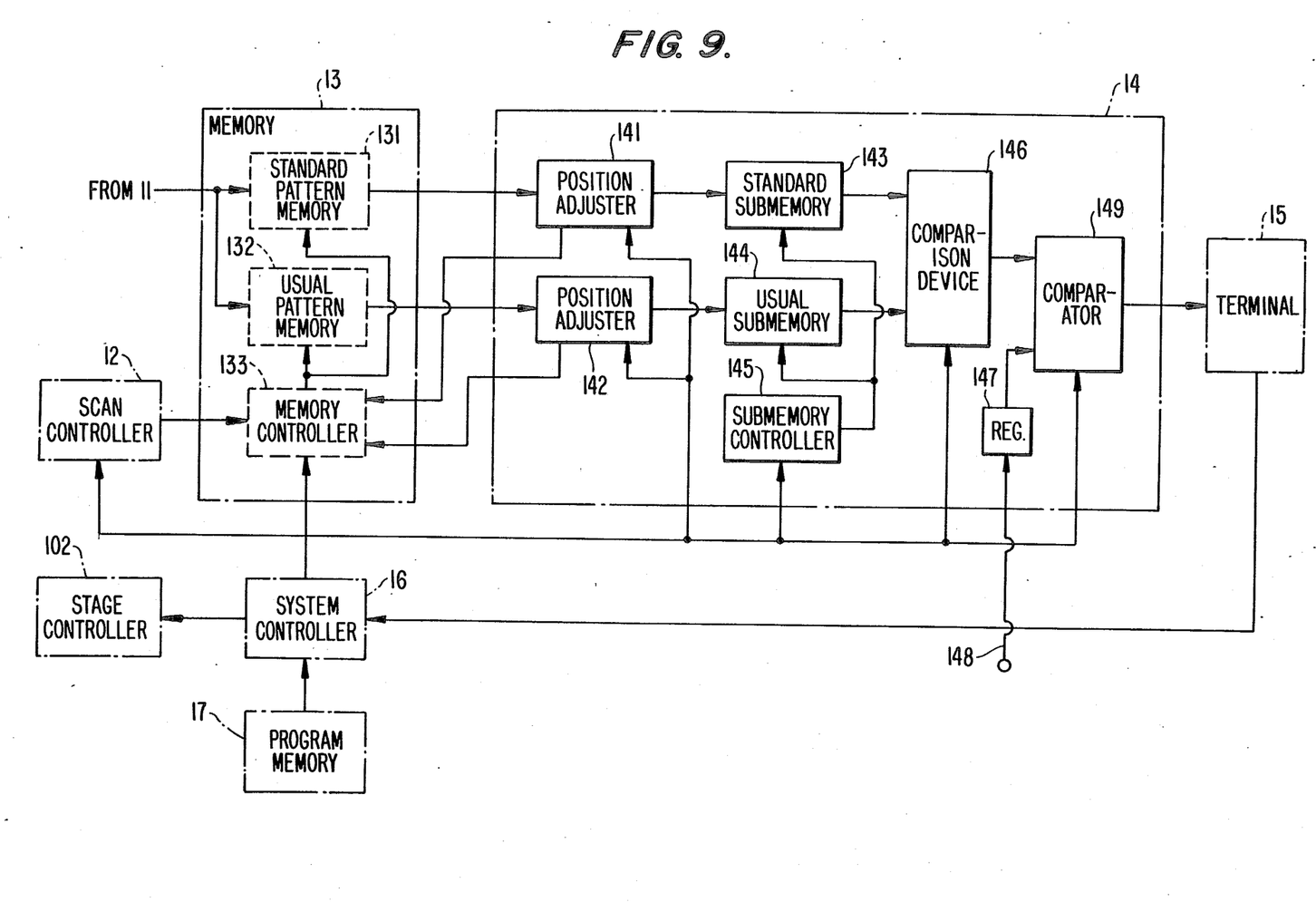
FIG. 9 illustrates the apparatus of the present invention in a more detailed block diagram format.
Figure 10A:
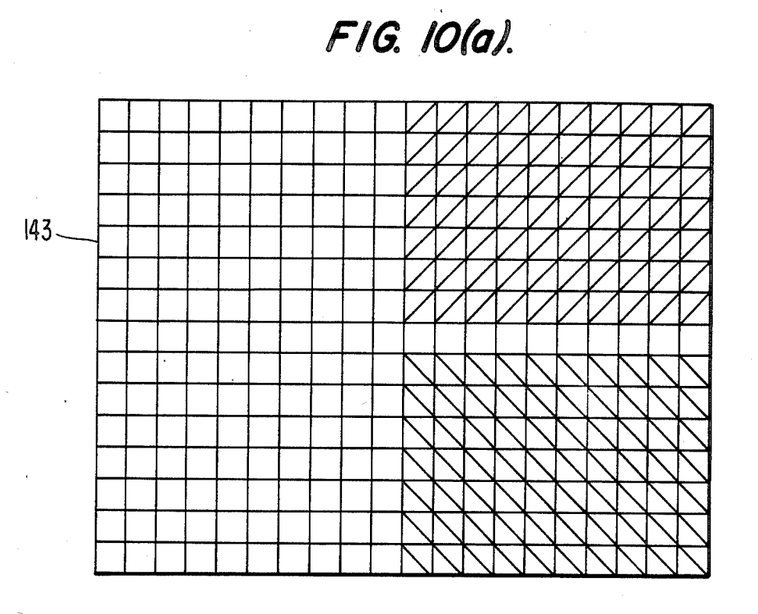
FIGS. 10(a)-10(b), is an example of memory contents used for comparison.
Figure 10B:
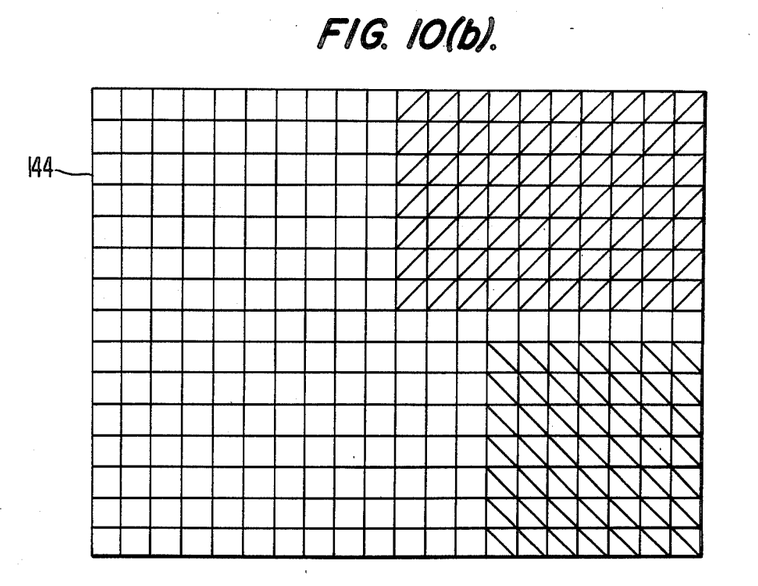

FIG. 9 illustrates the comparision device 14 in more detail. After the images are aligned by position adjusters 141 and 142 and stored in submemories 143 and 144, the submemories are read out and sent to a comparison device 146 in which the signals from the standard pattern and other combined patterns are compared and an amount of difference is produced based on each comparison of each combined pattern with the standard pattern. The amount of difference is obtained by counting the total number of "0"s in each submemory, and subtracting the totals to get a shear difference. This process is controlled by program memory 17 through system controller 16. FIGS. 10(a) and 10(b) are simplified representations of the contents of the standard 143 and usual 144 submemories. In the examples of 10(a) and 10(b), for simplicity of explanation, a 20 by 15 matrix is used instead of a 60 by 60 matrix. In FIG. 10(a), the standard submemory 143 has 160 memory locations storing a "0" and usual submemory 144 in FIG. 10(b) has 181 memory locations storing a "0" resulting in a difference of 21 being produced by comparison device 146. The two counts can be produced by simply shifting each of the memory locations in each memory out one at a time and counting the number of "0"s using a standard counter. The difference can then be produced by simply subtracting the counted values using a standard subtractor.

A shear deviation allowance or tolerance level is provided, according to the size of the features or details of the photomask pattern, in the comparison device, that is, the tolerance level is determined in accordance with the tolerance in shift that the masks will accept and still produce a working IC. The tolerance is stored in register 147 (see FIG. 9) through input terminal 148. The amount of difference produced by the comparison device 146 is respectively compared with the allowance level stored in register 147 by comparator 149 and if the amount exceeds the tolerance level, the comparator 149 outputs an indication that the photomask has an incorrect arrangement of the unit patterns. This output goes to an output or display terminal 15 in which the information is displayed and/or recorded indicating the location of an incorrect part on the mask. When the inspection for a group of the combined patterns is completed, the inspection is repeated for the next group until another incorrect part is found; this repetition can be performed by the program.

The vernier pattern used in the prior art inspection method can be also used in the present invention. However, the shear-detecting-pattern as mentioned above is sufficient.

Using the present invention, the locations of all unit patterns on the photomask can be completely inspected without any observation and measurement by an inspector. Using the present invention, the inspecting time can be reduced to as little as 30 minutes for a photomask pattern having 5,000 unit patterns, for example, even though the inspection is performed for all the unit patterns.

Furthermore, in the situation illustrated in FIG. 5, according to the prior art vernier method, the shear would be determined as an incorrect pivoting pitch, because the amount of shear is more than the usual amount. According to the present invention, however, since the shear of each unit pattern is the same, the mask of FIG. 5 would be indicated as satisfactory, thus saving an expensive mask.

The method of the present invention could be practiced using a different alignment and comparison device than illustrated in FIG. 9. For example, the sensor can be scanned by a computer and the images stored in a computer memory. The computer could then do the appropriate shifting to align the pattern edges. Thereafter, the computer could count the number of occupied memory locations for each pattern, subtract the counts and compare the difference to the tolerance level. A program for such could be provided by one of ordinary skill in the art based on the details of the method discussed herein. One of ordinary skill in the art will recognize that the method and apparatus described herein could be applied to other types of masks, for example, electron beam masks.

The many features and advantages of the invention are apparent from the detailed specification and thus it is intended by the appended claims to cover all such features and advantages of the method and apparatus which fall within the true spirit and scope of the invention. Further, since numerous modifications and changes will readily occur to those skilled in the art as discussed above, it is not desired to limit the invention to the exact construction and operation illustrated and described, and, accordingly, all suitable modifications and equivalents may be resorted to, falling within the scope of the invention.

What is claimed is:

1. A method of inspecting unit patterns on a mask, each unit pattern having a shear-detecting-pattern printed thereon, by using a memory, said method comprising the steps of:
   (a) storing first and second images of first and second pairs of adjacent shear-detecting-patterns, respectively, in the memory where occupied memory locations indicate one of the absence and existance of a portion of the pattern at corresponding points in the images; and
   (b) comparing the number of occupied memory locations for the first and second shear-detecting-pattern images and outputting an indication of whether a relative amount of shear of the first and second shear detecting patterns is within a tolerance level.

2. A method as recited in claim 1, wherein step (b) comprises the steps of:
(bi) counting a number of occupied memory locations for both the first and second images;
(bii) computing a difference from the numbers;
(biii) comparing the difference with a shear tolerance level and outputting the indication when the shear tolerance level is exceeded.

3. A method as recited in claim 1, wherein step (a) comprises the steps of:
(ai) scanning the first and second images and storing digital representations of the images in the memory; and
(aii) aligning the first and second images.

4. A method as recited in claim 3, wherein step (aii) comprises the steps of:
(1) scanning the first and second images to determine the leftmost occupied memory location; and
(2) shifting the contents of the memory until the leftmost occupied memory location is the centermost memory location.

5. A method of inspecting unit patterns each having the same shape and size and being printed repeatedly at equal intervals on a mask, comprising the steps of:
(a) printing a shear-detecting-pattern near each edge of each unit pattern in such a position that shear-detecting-patterns at mutually adjacent edges of neighboring unit patterns are adjacent each other to produce a combined pattern;
(b) designating a standard pattern from a group of combined patterns;
(c) comparing the standard pattern with the other combined patterns in said group;
(d) producing an amount of difference for each comparison;
(e) comparing an allowance level to the amount of difference;
(f) indicating the arrangement of the combined patterns in the group is correct when the amount is below the allowance level and indicating the arrangement is incorrect when the amount exceeds the allowance level; and
(g) repeating steps (b)-(f) for other groups of combined patterns.

6. An apparatus for inspecting unit patterns on a mask, each unit pattern having a shear-detecting-pattern thereon, comprising:
scanning means for scanning first and second pairs of adjacent shear-detecting-patterns and producing first and second images;
storage means for storing the first and second images; and
shear comparison means for comparing relative shear of the first and second pairs of shear detecting patterns in the images stored in said storage means and for producing an indication of whether the relative shear is within a shear tolerance.

7. An apparatus as recited in claim 6, wherein said storage means comprises:
a memory for storing the first and second images where occupied memory locations indicate one of the existance and absence of a pattern at corresponding locations in the images, and
wherein said shear comparision means comprises:
means for counting a number of occupied memory locations in each image;
means for producing a difference between the numbers; and
means for comparing the difference to the shear tolerance and producing the indication when the difference exceeds the shear tolerance.

8. An apparatus as recited in claim 7, wherein said shear comparison means further comprises alignment means for aligning the first and second images prior to counting.

9. An apparatus as recited in claim 8, wherein said alignment means comprises:
means for detecting the leftmost occupied memory location; and
means for shifting the contents of the memory until the leftmost occupied memory location occupies the centermost memory location.

10. A mask inspecting apparatus for inspecting a mask, comprising:
means for designating a standard pattern in groups of combined patterns on the mask;
a stage for mounting and shifting the mask to be inspected;
a stage controller, connected to said stage, for shifting said stage in a step and repeat type movement in latitudinal and longitudinal directions;
optical means for producing, one at a time, an optical image of each combined pattern in each group from the mask on the stage;
image sensing means, connected to said optical means, for scanning and converting the optical image into electric signals;
scan controller means, connected to said stage controller and said image sensing means, for controlling the scanning and for producing address signals for the optical image in correspondence with the converted electric signals;
memory means, connected to said scan controller means and including first and second memories, for dividing the converted electric signals into first signals for said standard pattern and second signals for another combined pattern in said group and for storing the first signals in the first memory and the second signals in the second memory;
means for comparing the first and second signals read out from the respective first and second memories;
means for providing an amount of difference for each comparison;
means for providing an allowance level for the difference;
means for indicating the arrangement of the unit patterns is correct or incorrect in dependance upon a comparison of the amount of difference with the allowance level; and
means for executing sequentially, comparisons for each group of combined patterns.

* * * * *